US011955406B2

(12) United States Patent
Wang et al.

(10) Patent No.: US 11,955,406 B2
(45) Date of Patent: Apr. 9, 2024

(54) TEMPERATURE CONTROL ELEMENT UTILIZED IN DEVICE DIE PACKAGES

(71) Applicant: Google LLC, Mountain View, CA (US)

(72) Inventors: Yingying Wang, Sunnyvale, CA (US);
Emad Samadiani, Cypress, CA (US);
Madhusudan K. Iyengar, Foster City, CA (US); Padam Jain, San Jose, CA (US); Xiaojin Wei, Dublin, CA (US);
Teckgyu Kang, Saratoga, CA (US);
Sudharshan Sugavanesh Udhayakumar, Santa Clara, CA (US);
Yingshi Tang, Danville, CA (US)

(73) Assignee: Google LLC, Mountain View, CA (US)

( * ) Notice: Subject to any disclaimer, the term of this patent is extended or adjusted under 35 U.S.C. 154(b) by 189 days.

(21) Appl. No.: 17/570,647

(22) Filed: Jan. 7, 2022

(65) Prior Publication Data
US 2023/0163048 A1    May 25, 2023

Related U.S. Application Data

(60) Provisional application No. 63/281,287, filed on Nov. 19, 2021.

(51) Int. Cl.
*H01L 23/46*    (2006.01)
*H01L 21/56*    (2006.01)
*H01L 23/00*    (2006.01)

(52) U.S. Cl.
CPC .............. *H01L 23/46* (2013.01); *H01L 21/56* (2013.01); *H01L 24/16* (2013.01); *H01L 24/29* (2013.01);
(Continued)

(58) Field of Classification Search
CPC ......... H01L 23/46; H01L 21/56; H01L 24/16; H01L 24/29; H01L 24/32; H01L 24/73;
(Continued)

(56) References Cited

U.S. PATENT DOCUMENTS 7,459,782 B1    12/2008 Li
7,724,527 B2    5/2010 Coico et al.
(Continued)

OTHER PUBLICATIONS

Extended European Search Report for European Patent Application No. 22188536.1 dated Apr. 19, 2023. 8 pages.

*Primary Examiner* — Peniel M Gumedzoe
(74) *Attorney, Agent, or Firm* — Lerner David LLP

(57) ABSTRACT

An IC die includes a temperature control element suitable for three-dimensional IC package with enhanced thermal control and management. The temperature control element may assist temperature control of the IC die when in operation. In one example, the temperature control element may have a plurality of thermal dissipating features disposed on a first surface of the IC die to efficiently control and dissipate the thermal energy from the IC die when in operation. A second surface opposite to the first surface of the IC die may include a plurality of devices, such as semiconductors transistors, devices, electrical components, circuits, or the like, that may generate thermal energy when in operation. The temperature control element may provide an IC die with high efficiency of heat dissipation that is suitable for 3D IC package structures and requirements.

17 Claims, 12 Drawing Sheets

(52) U.S. Cl.
CPC .............. *H01L 24/32* (2013.01); *H01L 24/73* (2013.01); *H01L 2224/16227* (2013.01); *H01L 2224/29035* (2013.01); *H01L 2224/32221* (2013.01); *H01L 2224/73253* (2013.01)

(58) Field of Classification Search
CPC . H01L 2224/16227; H01L 2224/29035; H01L 2224/32221; H01L 2224/73253
See application file for complete search history.

(56) References Cited

U.S. PATENT DOCUMENTS

| | | |
|---|---|---|
| 7,781,883 B2 | 8/2010 | Sri-Jayantha et al. |
| 8,299,608 B2 | 10/2012 | Bartley et al. |
| 9,070,656 B2 | 6/2015 | Hooper et al. |
| 9,735,043 B2 | 8/2017 | Ho et al. |
| 10,553,522 B1 | 2/2020 | Canaperi et al. |
| 2011/0042784 A1 | 2/2011 | Edwards et al. |
| 2012/0006383 A1 | 1/2012 | Donnelly |
| 2013/0119527 A1* | 5/2013 | Luo .................... H01L 25/0657 165/185 |
| 2014/0126150 A1 | 5/2014 | Song et al. |
| 2014/0307388 A1 | 10/2014 | Chiu |
| 2019/0074237 A1 | 3/2019 | Beauchemin et al. |
| 2019/0385925 A1 | 12/2019 | Walczyk et al. |
| 2021/0020538 A1* | 1/2021 | Chen ................. H01L 21/32051 |
| 2021/0098335 A1 | 4/2021 | Yu et al. |
| 2021/0159139 A1* | 5/2021 | Yu .......................... H01L 23/04 |
| 2021/0407887 A1* | 12/2021 | Yu ...................... H01L 23/3157 |

* cited by examiner

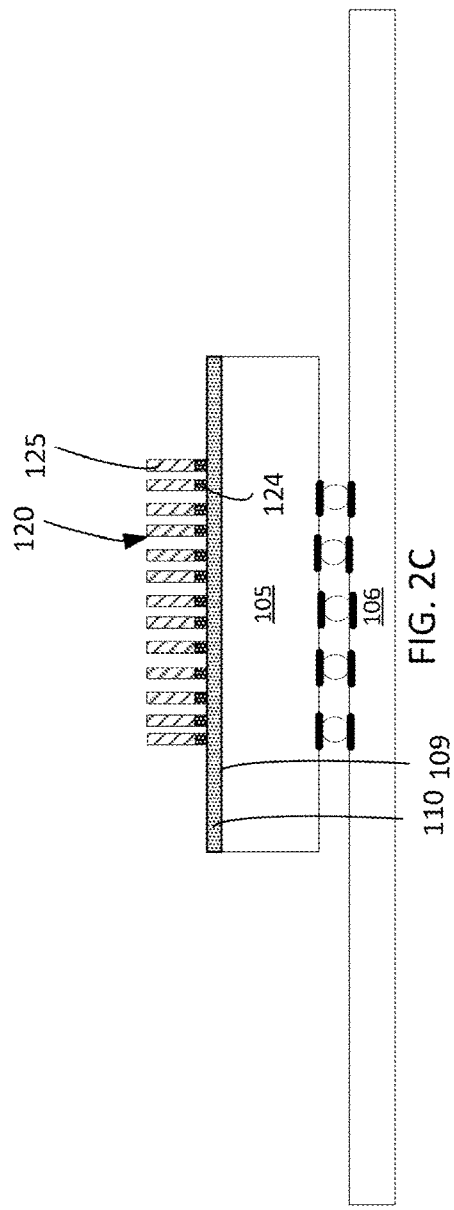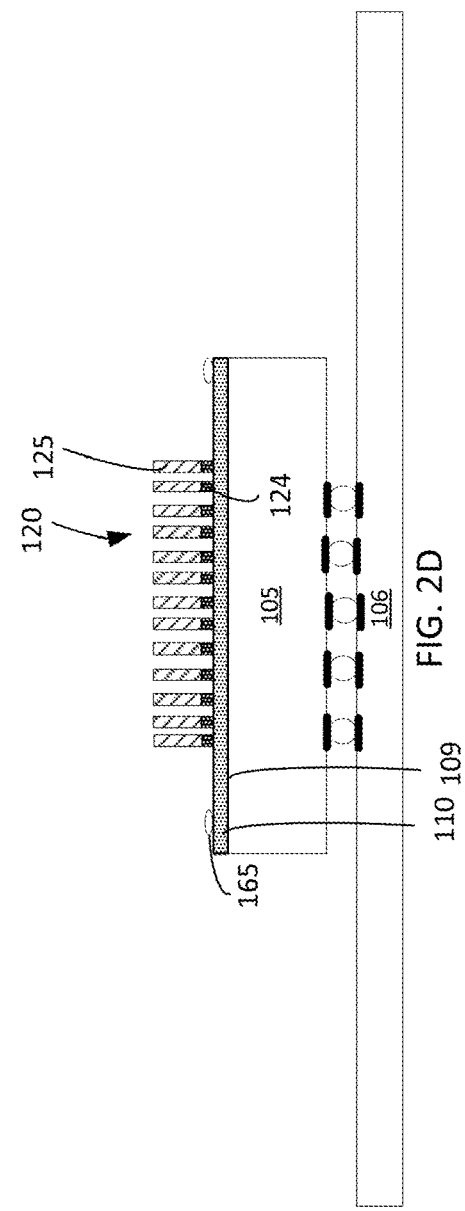

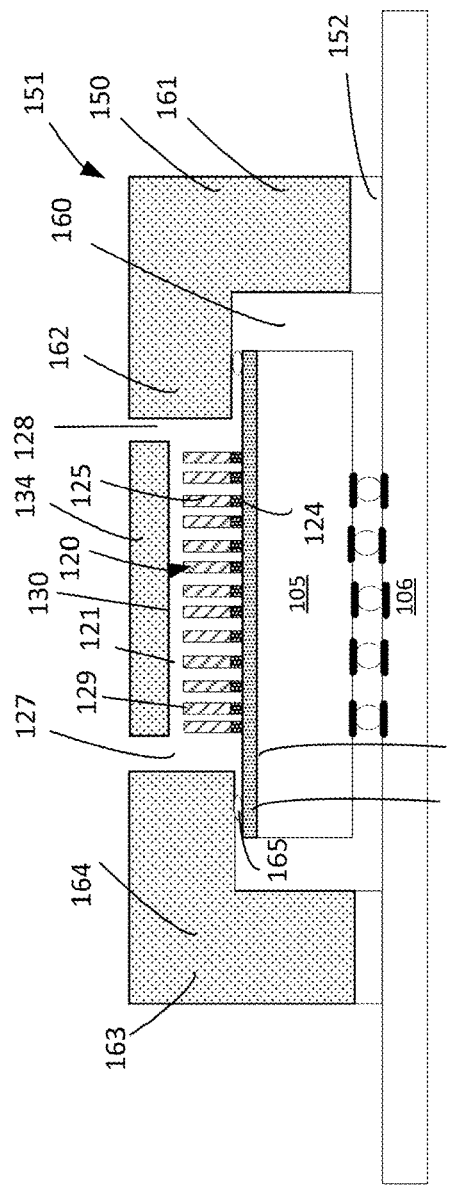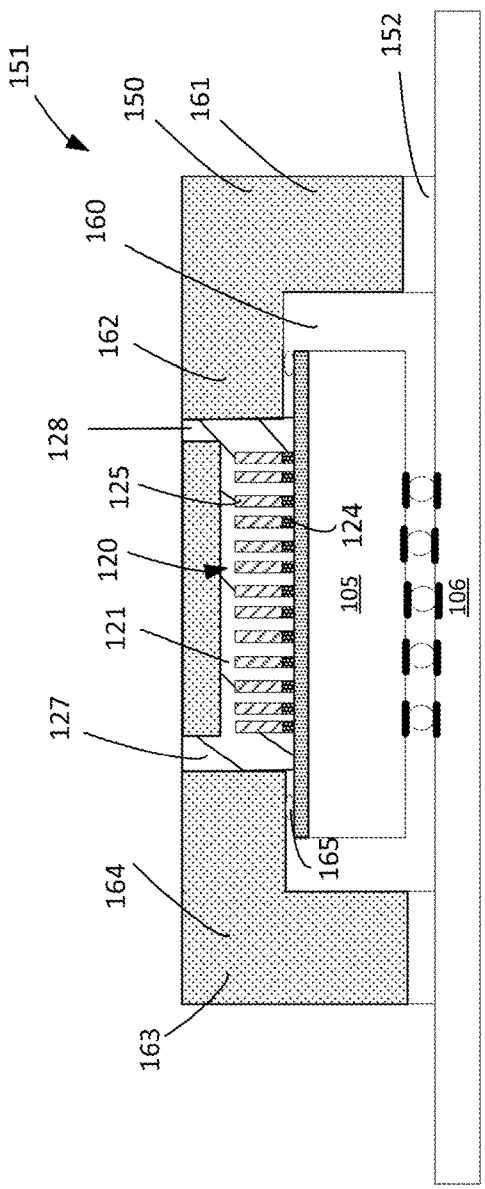

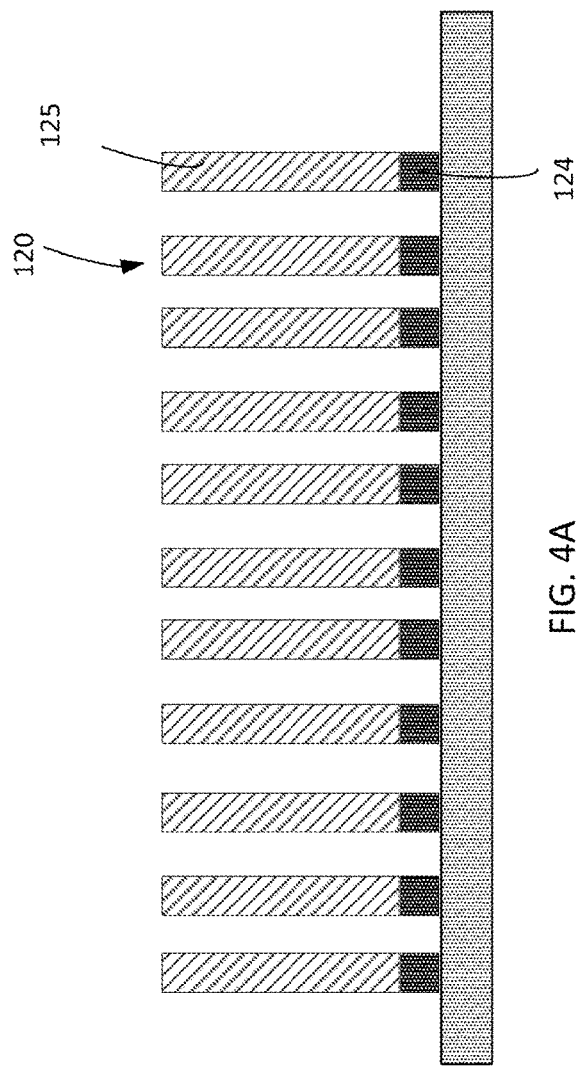
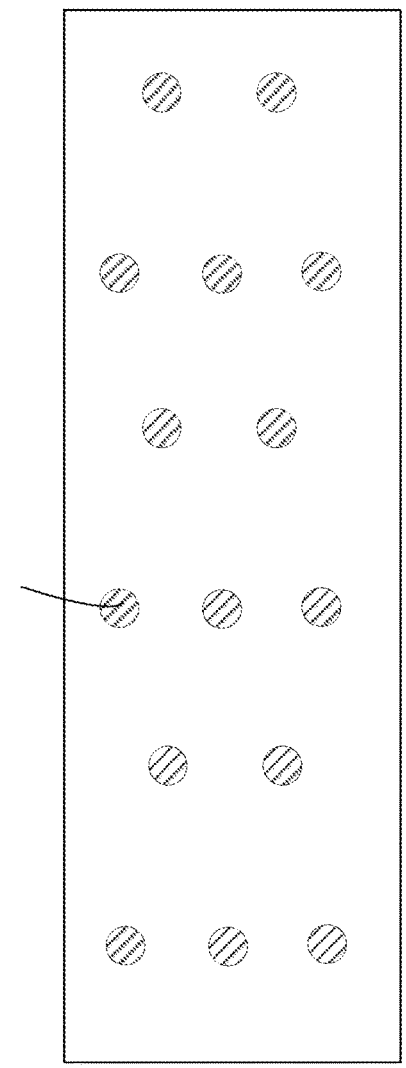
FIG. 4A
FIG. 4B

TEMPERATURE CONTROL ELEMENT UTILIZED IN DEVICE DIE PACKAGES

CROSS-REFERENCE TO RELATED APPLICATIONS

The present application claims the benefit of the filing date of U.S. Provisional Patent Application No. 63/281,287, filed Nov. 19, 2021, the disclosure of which is hereby incorporated herein by reference.

BACKGROUND

Electronic devices, such as tablets, computers, copiers, digital cameras, smart phones, control systems and automated teller machines, among others, often employ electronic components such as chip assemblies or integrated circuit (IC) dies that are connected by various interconnect components. The chip assemblies or IC dies may include memory, logic, devices, or other IC dies.

The demand for IC dies or chip assemblies for higher performance, higher capacity and lower cost has driven the demand for small sizes and more capable microelectronic components. Furthermore, the distribution and the distance among the IC dies also becomes denser and closer. Proper thermal management and cooling of the chip assemblies during operation has become increasing important.

However, due to the space constraints of the IC package, some chip assemblies may have lower cooling efficiency than others, resulting in overheating. Such overheating may result in device failure or electrical performance deterioration.

SUMMARY

The present disclosure relates to an IC package assembly comprising a temperature control element. The temperature control element may be an integral part of the IC package assembly that may assist temperature control of the IC die when in operation. When such IC package assembly with temperature control element is assembled, the thermal dissipation efficiency for the overall IC package is then enhanced. In one example, an integrated circuit (IC) package includes an IC die disposed on a printed circuit board (PCB), and a temperature control element encasing the IC die. The temperature control element includes a plurality of thermal dissipating features disposed on a first surface of the IC die. A manifold is disposed on the PCB encasing the plurality of thermal dissipating features disposed on the IC die.

In one example, each of the thermal dissipating features includes a metallic pin fin disposed on a solder bump. The metallic pin fin is manufactured from a material selected from copper, aluminum, tungsten, gold, silver, combinations thereof or alloys thereof. The plurality of thermal dissipating features is arranged in arrays or matrix.

In one example, a sealing member is disposed between the manifold and the IC die. The manifold includes a first sidewall, a second sidewall, and a ceiling disposed between the first and the second sidewall, defining a central cavity that allows the IC die to be encased therein. In one example, a plenum is defined in a center portion of the ceiling. The plenum allows fluid to flow therethrough from an inlet to an outlet of the plenum.

In one example, a spacer is disposed between the thermal dissipating feature and the manifold. The plurality of thermal dissipating features has a circular configuration, a rectangular configuration, or a longitudinal structure. In one example, the thermal dissipating features have different aspect ratios. The thermal dissipating features is divided into a first and a second zone disposed on the IC die. The first zone has a higher number of the thermal dissipating features than the thermal dissipating features disposed in the second zone.

In one example, the plurality of the thermal dissipating features has a top surface spaced apart from the manifold. The plurality of the thermal dissipating features has a top surface in direct contact with the manifold. In one example, the IC die has a second surface opposite to the first surface, wherein device structures are formed on the second side of the IC die.

Another aspect of the technology is directed to a temperature control element. The temperature control element includes a plurality of thermal dissipating features configured to be disposed on a surface of the IC die. A manifold having a plenum is configured to encase the plurality of thermal dissipating features disposed on the IC die.

In one example, each of the thermal dissipating features includes a metallic pin fin disposed on a solder bump. The plenum is configured to receive fluid to control temperature of the IC die when in operation.

Yet another aspect of the technology is directed to a method for manufacturing a temperature control element in an IC package. The method includes disposing a plurality of thermal dissipating features on an IC die disposed on a PCB, placing a manifold on the PCB to encase the IC die therein while maintaining the plurality of thermal dissipating features located in a plenum defined in the manifold, and supplying a fluid into the plenum to regulate thermal energy transmitted from the IC die.

DESCRIPTION OF THE DRAWINGS

FIGS. 2A-2F depict cross sectional view of an IC package assembly including different stages of implementing a temperature control element on an IC die of the IC package assembly in accordance with aspects of the disclosure.

FIG. 4A depicts a cross-sectional view of a plurality of thermal dissipating features in accordance with aspects of the disclosure.

FIG. 4B depicts a top view of the plurality of thermal dissipating features of FIG. 4A in accordance with aspects of the disclosure.

DETAILED DESCRIPTION

The technology relates generally to a temperature control element that may be utilized to control a temperature of an IC die integrated in an IC packaging assembly. The temperature control element may be formed on an IC die to assist temperature control of the IC die when in operation. In one example, the temperature control element may have a plurality of thermal dissipating features disposed on a first surface of an IC die encased under a manifold to efficiently control and dissipate the thermal energy from the IC die when in operation. A second surface opposite to the first surface of the IC die may include a plurality of devices, such as semiconductors transistors, devices, electrical components, circuits, or the like, that may generate thermal energy when in operation. The thermal dissipating features may be manufactured from a heat dissipation material to assist dissipating thermal energy generated by the plurality of devices in the IC die during operation. Different configurations of the thermal dissipating features may be utilized to accommodate different device layouts with different thermal energy generation across the substrate in the IC die.

Figure 1:
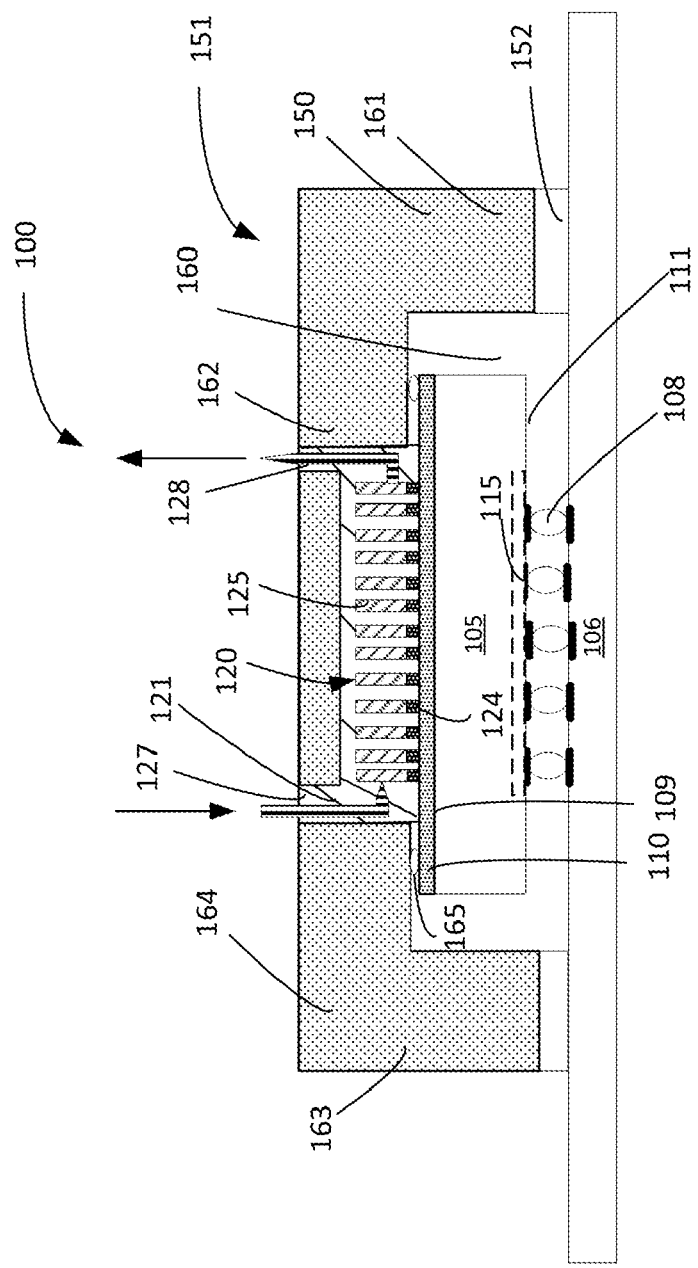
FIG. 1 depicts a cross-sectional view of a temperature control element utilized in an IC package assembly in accordance with aspects of the disclosure.

FIG. 1 depicts a cross sectional-view of an IC package 100 including an IC die 105 formed on a printed circuit board (PCB) 106. Although in the example depicted in FIG. 1 only includes one IC die 105, it is noted that one or more IC dies or IC die assemblies may be utilized or disposed on the PCB 106. For example, the IC dies and the devices or chip assemblies disposed in the IC package 100 may be in any numbers. In one example, the IC die 105 utilized herein may be a graphics processing unit (GPU), custom application-specific integrated circuit (ASIC), memory devices, high-bandwidth memory (HBM) components or any other type of devices or stacks. In one example, the IC die 105 is disposed on the PCB 106 through a plurality of solder balls 108 arranged in a ball grid array (BGA). Other arrangements and connectors may include contacts arranged in a land grid array (LGA), connector pins arranged in a pin grid array (PGA), etc.

In one example, a temperature control element 151 is utilized to encase the IC die 105. The temperature control element 151 overlies an adhesive material 152. The adhesive material 152 provides a good sealing interface between the temperature control element 151 and the PCB 106. The temperature control element 151 includes a manifold 150 having a first side wall 161 and a second sidewall 163 connected by a ceiling 162, forming a substantially U-shape body 164 that defines a central cavity 160 on a bottom side of the manifold 150. The central cavity 160 may encase one or more IC dies 105 positioned therein when the temperature control element 151 is placed or mounted on the PCB 106. A sealing member 165 may be utilized to seal the interface where the manifold 150 is in contact with the IC die 105. In one example, the sealing member 165 may be an adhesive material, a O ring, or suitable mechanical attachments that facilitate positioning and securement of the manifold 150 to the IC die 105. A plenum 121 may be defined in the ceiling 162 of the manifold 150. The plenum 121 may allow fluid, air, or liquid to be flown therein for temperature control purposes to the IC die 105 when the temperature control element 151 is in place for operation.

A plurality of thermal dissipating features 120 may be disposed on a first surface 109 of the IC die 105 that may assist dissipating thermal energy from the IC die 105 when IC die 105 is in operation. In one example, the plurality of thermal dissipating features 120 may be disposed on the first surface 109 of the IC die 105 by plating, depositing or soldering. A second surface 111 is formed substantially in paragraph and opposite to the first surface 109 where a plurality of device structures 115 may be disposed to form the IC die 105. A metallization layer 110 may be formed on the surface 109 of the IC die 105 to facilitate soldering the plurality of thermal dissipating features 120 thereon. In one example, the metallization layer 110 may be manufactured from a conductive material, such as copper, aluminum, tungsten, nickel, silver, iron, combinations thereof, alloys thereof or the like.

Figure 2A:
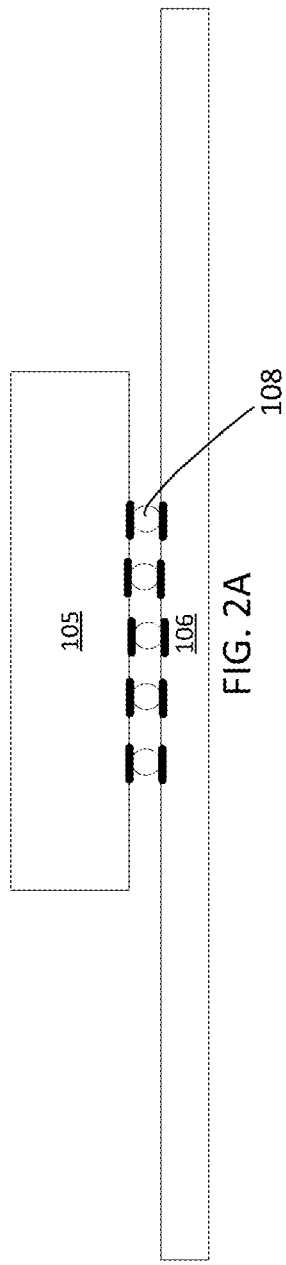
Figure 2B:
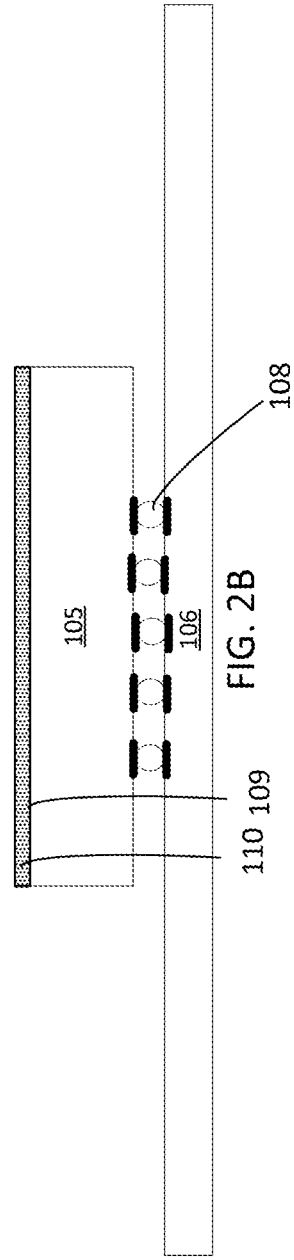

In one example, each of the thermal dissipating features 120 may include a metallic pin fin 125 disposed on a solder bump 124. The solder bump 124 may assist soldering the metallic pin fins 125 onto the first surface 109 of the IC die 105. In one example, the metallic pin fin 125 may be manufactured from a material that has good thermal dissipation or thermal transmission efficiency. Suitable examples of the materials that may be selected to manufacture the metallic pin fin 125 include copper, aluminum, tungsten, gold, silver, combinations thereof, alloys thereof, or the like. In one example, the thermal dissipating features 120 may be disposed on the surface 109 of the IC die 105 in the form of one or more arrays or matrices. When in operation, fluid may be supplied from an inlet 127 to circulate through the plenum 121 to an outlet 128. In one example, the number and configuration of inlet 127 and outlet128 can vary, such as an inlet disposed between two outlets. The fluid as supplied may include liquid, air, or other suitable cooling mediums that may efficiently lower and/or cool the temperature of the IC die 102 with which the fluid is in direct contact. The thermal dissipating features 120, such as the metallic pin fins 125 included therein, may increase contact surface area when the fluid is in circulation in the plenum 121 so as to enhance the cooling performance FIGS. 2A-2F depict cross sectional views of an IC package assembly during different stages of implementing the temperature control element on the IC die 105 of FIG. 1. In FIG. 2A, the IC die 105 is soldered on the PCB 106. After the IC die 105 is soldered in place, the metallization layer 110 may be disposed on the surface 109 of the IC die 105, as shown in FIG. 2B. In some examples, the metallization layer 110 may be disposed and formed on the surface 109 of the IC die 105 prior to soldering to the PCB 106. For example, the metallization layer 110 may be deposited or formed on the IC die 105 as part of the manufacturing steps fulfilled by the IC manufacturing facilities prior to shipping to the IC packaging facility to be soldered on the PCB 106.

In FIG. 2C, a plurality of the thermal dissipating features 120 is disposed on the surface 109 of the IC die 105. The thermal dissipating features 120 may be soldered onto the IC die 105 by the solder bumps 124 included therein. The solder bumps 124 may facilitate attaching the metallic pin fins 125 onto the surface 109 of the IC die 105 for temperature control when in operation.

In FIG. 2D, after the plurality of thermal dissipating features 120 are disposed in place, the sealing member 165 may be disposed on the IC die 105.

In FIG. 2E, the manifold 150 may be disposed on the PCB 106 through adhesive material 152. The manifold 150 is positioned in a manner that allows the central cavity 160 of the manifold 150 to encase the IC die 105 therein while allowing the plurality of thermal dissipating features 120 to be encased in the plenum 121. The height of the thermal dissipating features 120 may be controlled in a manner so that a top 129 of the thermal dissipating features 120 may be maintained spaced apart from a bottom surface 130 of the center portion 134 of the ceiling 162. It is noted that different configurations of the thermal dissipating features 120 may be utilized to enhance thermal energy circulation and thermal dissipating efficiency. Once the manifold 150 is placed on the PCB 106 with the plurality of thermal dissipating features 120 disposed on the IC die 105, the installation of the temperature control element 151, including the manifold 150 and the thermal dissipating features 120 is then considered completed.

In FIG. 2F, once the manifold 150 is in place, fluid may be supplied to the plenum 121 to facilitate temperature control of the IC die 105 through the plurality of thermal dissipating features 120 disposed on the IC die 105.

Figure 3A:
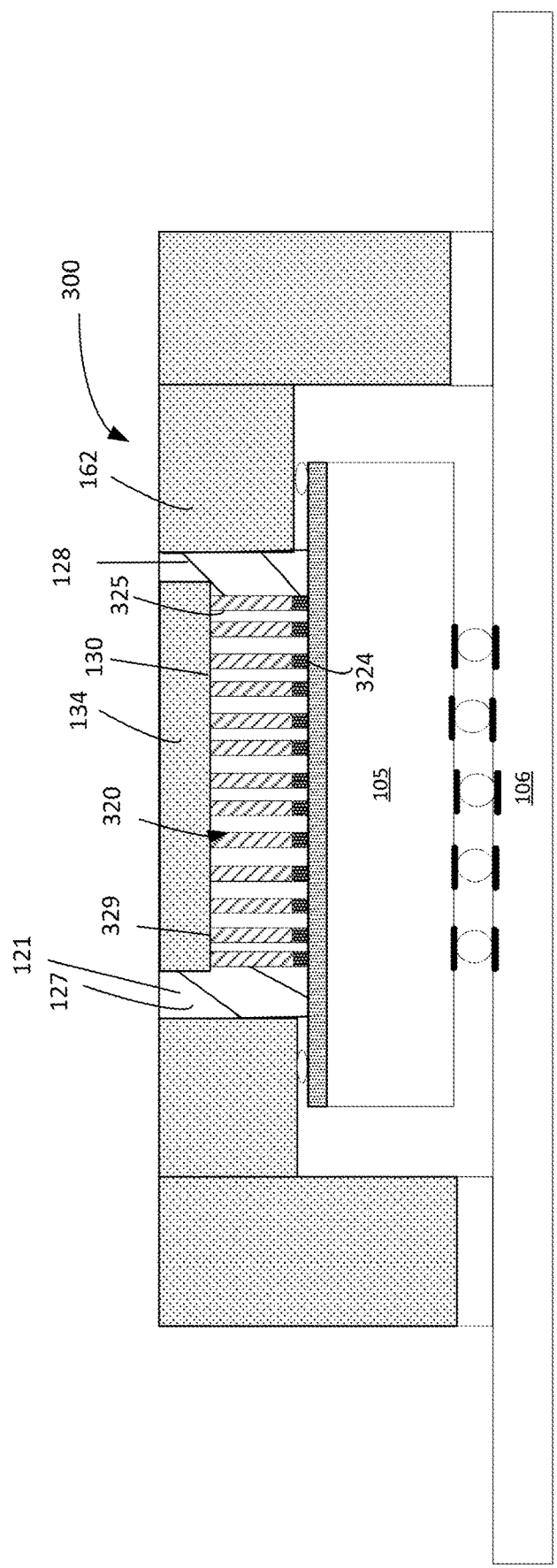
FIGS. 3A-3B depict cross-sectional views of different examples of temperature control elements utilized to control a temperature of an IC die in an IC package assembly in accordance with aspects of the disclosure.
Figure 3B:
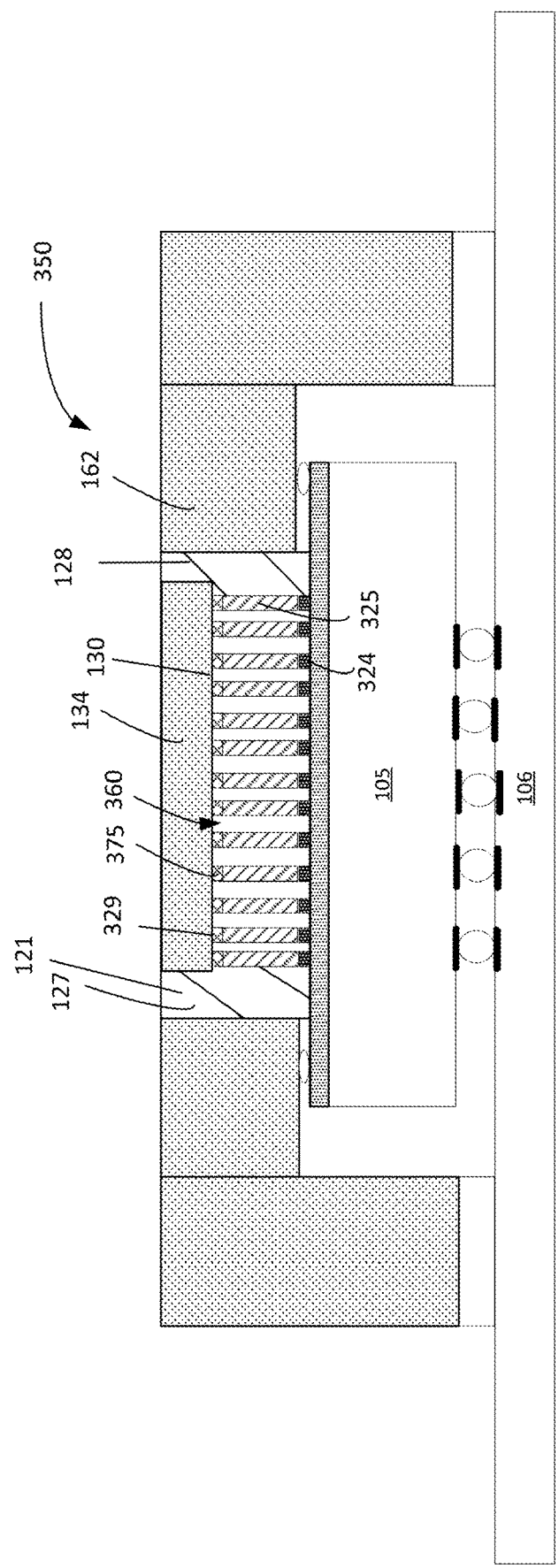

FIGS. 3A-3B depict cross-sectional views of different examples of temperature control elements 300, 350 utilized to control temperatures of the IC die 105 assembled in the IC package assembly in accordance with aspects of the disclosure. The temperature control element 300 of FIG. 3A is similar to the temperature control element 151 depicted in FIG. 1 and FIG. 2E-2F, except that the thermal dissipating features 320 may be configured differently. For example, the thermal dissipating features 320 may have a top surface 329 in direct contact with the bottom surface 130 of the center portion 134 of the ceiling 162. In another example, the temperature control element 350 of FIG. 3B has the thermal dissipating features 360 including a spacer 375 disposed between the thermal dissipating features 360 and the bottom surface 130 of the center portion 134 of the ceiling 162. The spacer 375 may further facilitate thermal energy dissipation at the interface between the manifold and the thermal dissipating features 360.

FIG. 4A depicts a cross-sectional view of the plurality of thermal dissipating features 120 and FIG. 4B depicts a top view of the thermal dissipating features 120 of FIG. 4A. As described above, the thermal dissipating feature 120 includes the metallic pin fin 125 disposed on the solder bump 124. The thermal dissipating feature 120 may be configured as arrays or matrix that includes multiple thermal dissipating features 120 equally or non-equally spaced apart from each other. As depicted in the top view of the thermal dissipating feature 120 in FIG. 4B, the thermal dissipating feature 120 may be configured in a circular configuration to facilitate thermal dissipation. In one example, the thermal dissipating feature 120 may have a diameter between about 20 μm and about 80 μm.

Figure 5A:
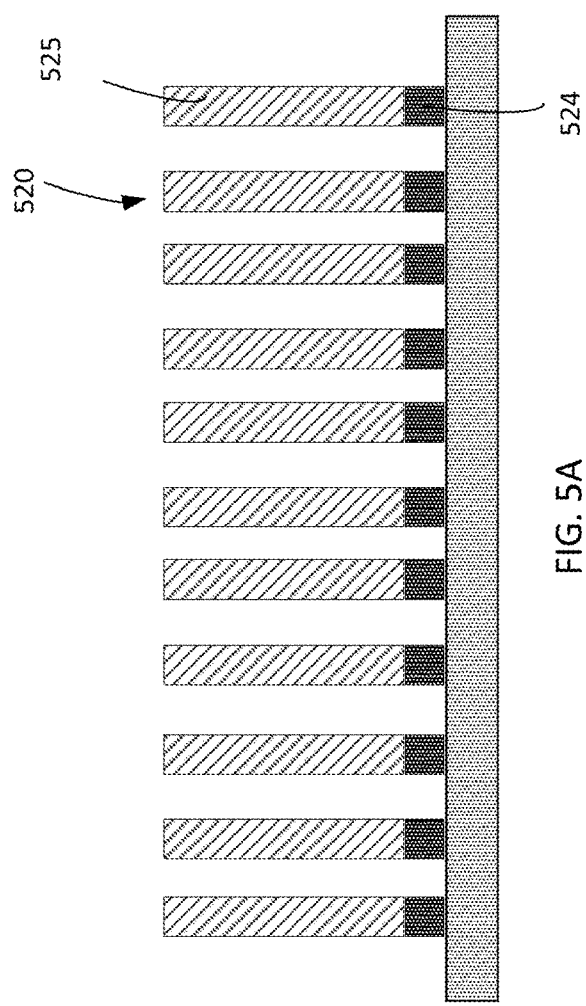
FIG. 5A depicts a cross-sectional view of another example of a plurality of thermal dissipating features in accordance with aspects of the disclosure.
Figure 5B:
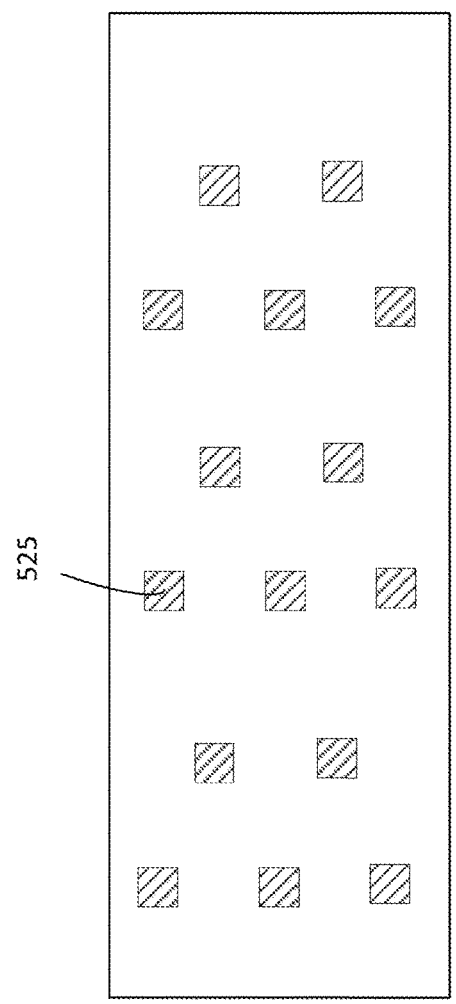
FIG. 5B depicts a top view of the plurality of thermal dissipating features of FIG. 5A in accordance with aspects of the disclosure.

In another example depicted in FIG. 5A-5B, the thermal dissipating feature 520 includes the metallic pin fin 525 disposed on the solder bump 524, as shown in the cross-sectional view of FIG. 5A. The thermal dissipating feature 520 may be configured as arrays or matrix that includes multiple thermal dissipating features 520 equally or non-equally spaced apart from each other. The thermal dissipating feature 520 may be configured to have a rectangular configuration as shown in the top view in FIG. 5B. In one example, the thermal dissipating feature 520 may have a dimension between about 20 μm and about 80 μm.

Figure 6A:
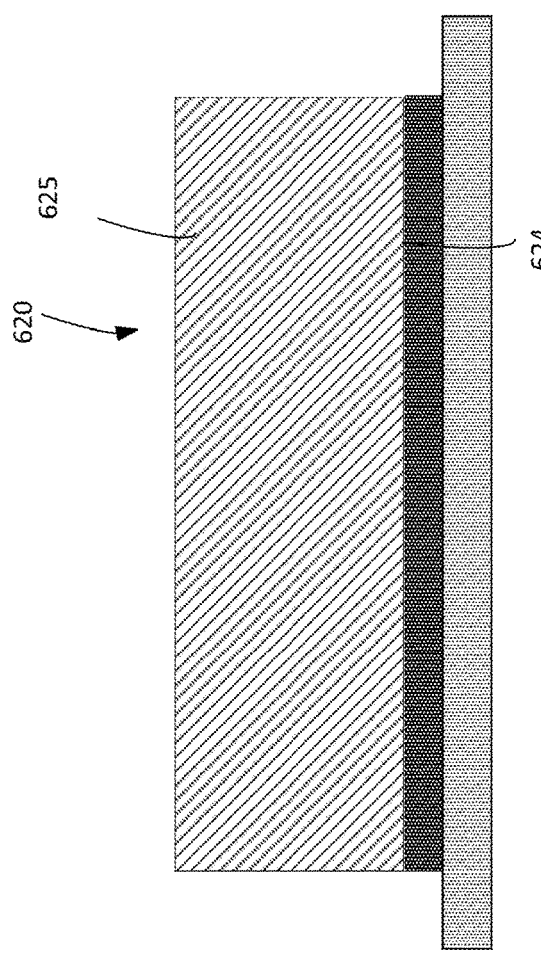
FIG. 6A depicts a cross-sectional view of another example of a plurality of thermal dissipating features in accordance with aspects of the disclosure.
Figure 6B:
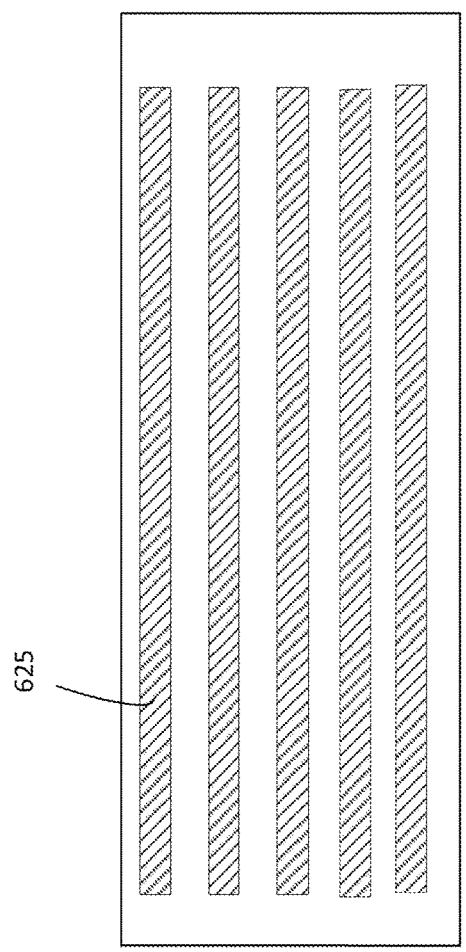
FIG. 6B depicts a top view of the plurality of thermal dissipating features of FIG. 6A in accordance with aspects of the disclosure.

In yet another example depicted in FIG. 6A-6B, the thermal dissipating feature 620 includes the metallic pin fin 625 disposed on the solder bump 624, as shown in the cross-sectional view of FIG. 6A. The thermal dissipating feature 620 may be configured as a longitudinal structure, such as in the form of bars as depicted in the top view of FIG. 6B, to facilitate dissipating thermal energy.

Figure 7:
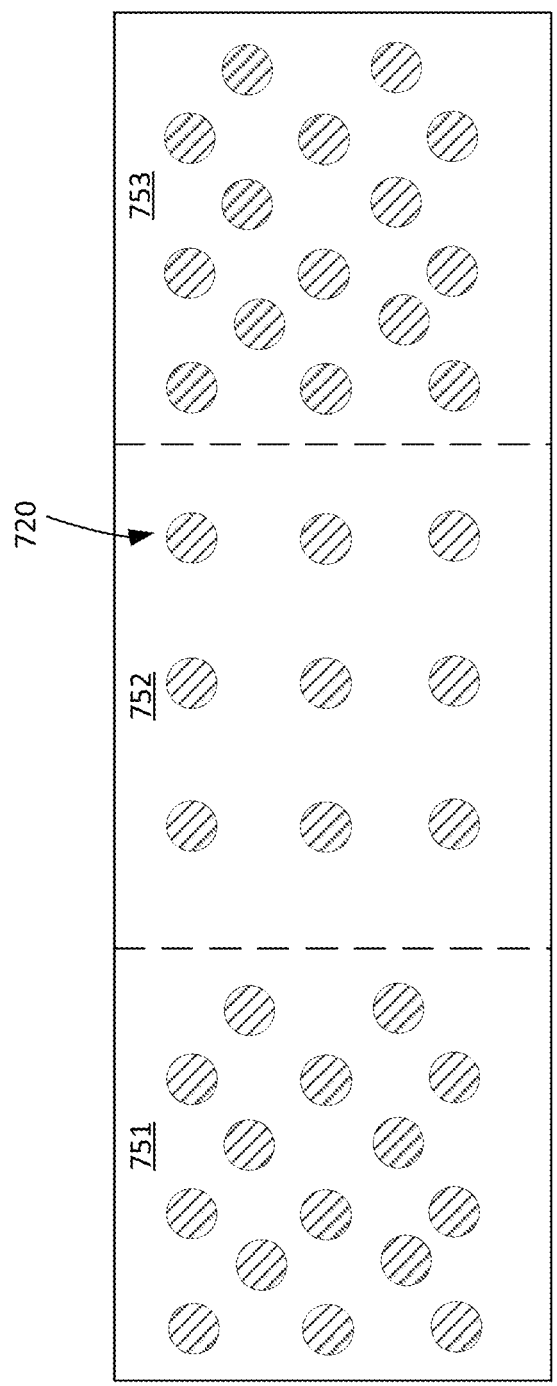
FIG. 7 depicts a top view of yet another example of a plurality of thermal dissipating features with multiple zones in accordance with aspects of the disclosure.

FIG. 7 depicts a top view of a plurality of thermal dissipating features 720 disposed on a surface of an IC die. In this example, the numbers and densities of how the thermal dissipating feature 720 is disposed and placed on the IC die may be grouped and divided into different zones. In the example depicted in FIG. 7, three zones 751, 752, 753 are utilized so as to dispose different numbers of the thermal dissipating feature 720 in different zones 751, 752, 753. For example, the numbers and the densities of the thermal dissipating features 720 may be disposed relatively higher in the edge zones 751, 753 relative to the center zone 752. By doing so, different thermal dissipation efficiencies may be obtained at different regions of the IC die so that a customized arrangement may be configured when the IC die has different device densities or device distributions across the width of the IC die. In one example, in the embodiment wherein the IC die has a high device density in a center region of the IC die, which generates higher thermal energy in the center region of the IC die, a relatively higher numbers or higher density of the thermal dissipating features 720 may be disposed on the center region of the IC die as well to facilitate efficient thermal energy in terms of the higher thermal energy as generated from the IC die. It is noted that the distribution, arrangement, numbers, and densities of the thermal dissipating features 720 disposed on the IC die may be divided into any numbers of the zones as necessary.

Figure 8:
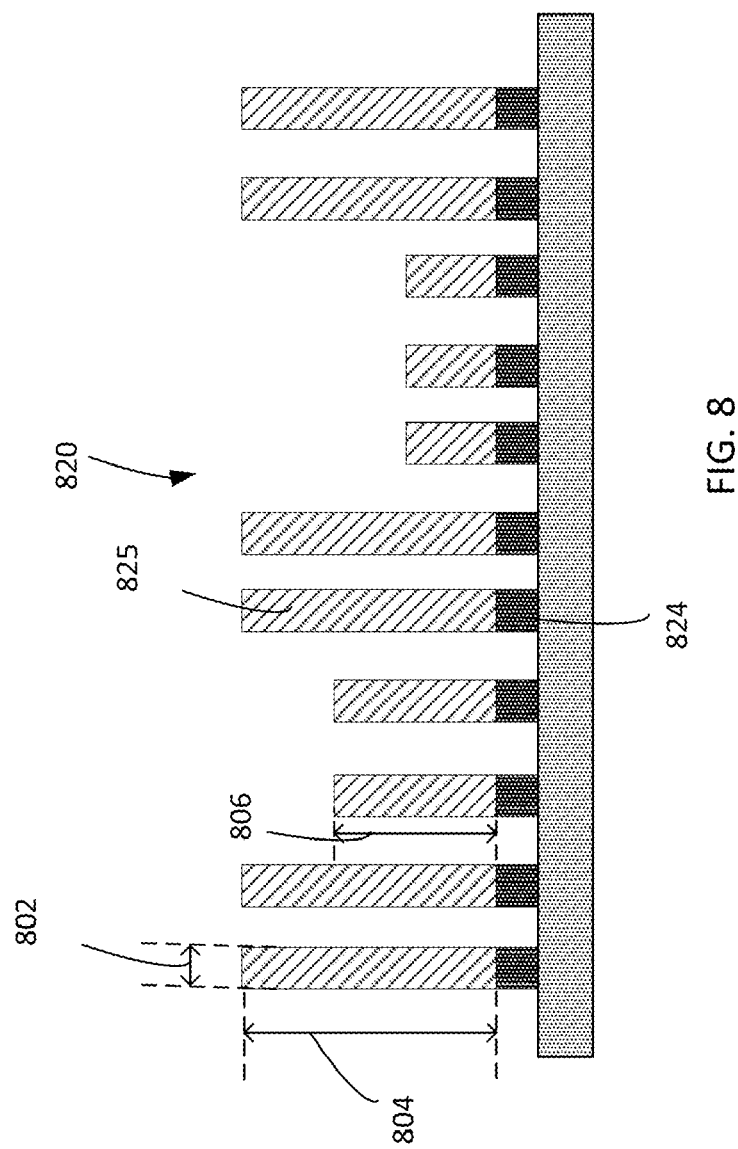
FIG. 8 depicts a side view of yet another example of a plurality of thermal dissipating features in accordance with aspects of the disclosure.

FIG. 8 depicts a cross sectional view of a plurality of thermal dissipating feature 820 disposed on a surface of an IC die. Similarly, each of the thermal dissipating feature 820 includes the metallic pin fin 825 disposed on the solder bump 824. In the example depicted in FIG. 8, the metallic pin fin 825 may be configured to have different heights to provide different thermal dissipating efficiency at different locations of the IC die, based on the design configurations and requirements from the IC die. For example, the thermal dissipating feature 820 may have a first group of the metallic pin fin 825 having a first height 804 greater than a second group of the metallic pin fin 825 having a second height 806. Thus, the thermal dissipating feature 820 disposed on the IC die may have different aspect ratios, such as different ratios (H/D) of the height (H) 806, 804 to the diameter 802 (D), among the thermal dissipating feature 820. By doing so, the thermal dissipation efficiency as well as the pressure control when the fluid is supplied in the plenum may be efficiently controlled.

Figure 9:
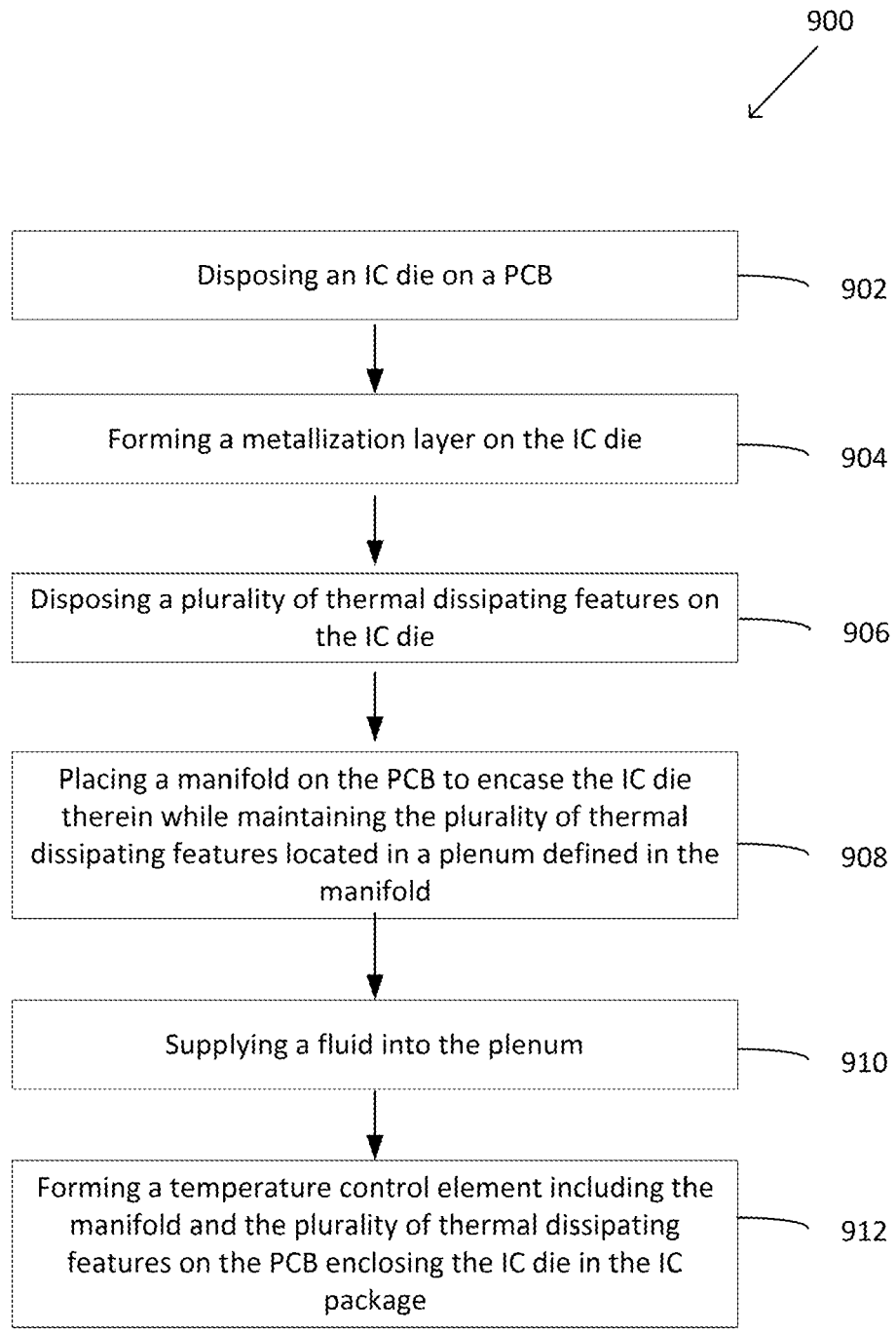
FIG. 9 depicts a flow diagram for manufacturing an IC package including an IC die including a temperature control element formed therein in accordance with aspects of the disclosure.

FIG. 9 depicts a flow diagram for manufacturing an IC package including an IC die having a temperature control element utilized to control the temperature of the IC die in accordance with aspects of the disclosure. Such method may be performed using suitable manufacturing processes, including depositing, etching, lithography, polishing, soldering, or any suitable techniques. It should be understood that the operations involved in the following methods need not be performed in the precise order described. Rather, various operations may be handled in a different order or simultaneously, and operations may be added or omitted.

Referring to FIG. 9, in block 902, an IC die, such as the IC die 105 described above, may be disposed on a PCB, such as the PCB 106 described above. The IC die 105 may include device structures, transistors, or other electronic components formed on a device region of the IC die 105.

In block 904, a metallization layer, such as the metallization layer 110, may be formed on the IC die. The metallization layer may be formed on a surface opposition to the surface where the device structures, transistors, or other electronic components are formed in the device region of the IC die.

In block 906, a plurality of thermal dissipating features may be disposed on the IC die.

In block 908, a manifold is placed on the PCB to encase the IC die therein while maintaining the plurality of thermal dissipating features located in a plenum defined in the manifold.

In block 910, a fluid may be supplied into the plenum of the manifold to efficiently control the temperature of the IC die through the plurality of thermal dissipating features.

In block 912, a temperature control element including the manifold and the plurality of thermal dissipating features is then implemented on the PCB encasing the IC die to form an IC package assembly with efficiency temperature dissipation control.

The features described herein allow a temperature control element being formed as an integral part of an IC package assembly that may have high heat dissipation efficiency to an IC die during operation assembled in the package assembly. The temperature control element may assist temperature control of the IC die when in operation. In one example, the temperature control element may have a plurality of thermal dissipating features disposed on a first surface of the IC die encased under a manifold to efficiently control and dissipate the thermal energy from the IC die when in operation. A second surface opposite to the first surface of the IC die may include a plurality of devices, such as semiconductors transistors, devices, electrical components, circuits, or the like, that may generate thermal energy when in operation. The thermal dissipating features may be manufactured from a heat dissipation material to assist dissipating thermal energy generated by the plurality of devices in the IC die during operation when a fluid is supplied in the temperature control element. Different configurations of the thermal dissipating features may be utilized to accommodate different device layouts with different thermal energy generation across the substrate in the IC die. Thus, the temperature control element may provide an IC die with high efficiency of heat dissipation that is suitable for 3D IC package structures and requirements.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

The invention claimed is:

1. An integrated circuit ("IC") package, comprising:
an IC die disposed on a printed circuit board ("PCB"), and
a temperature control element encasing the IC die, wherein the temperature control element comprises:
    a plurality of thermal dissipating features disposed on a first surface of the IC die;
    a manifold disposed on the PCB encasing the plurality of thermal dissipating features disposed on the IC die; and
    a spacer disposed between the plurality of thermal dissipating features and the manifold,
    wherein the plurality of thermal dissipating features comprises a metallic pin fin disposed on a solder bump.

2. The IC package of claim 1, wherein the metallic pin fin is manufactured from a material selected from copper, aluminum, tungsten, gold, silver, combinations thereof or alloys thereof.

3. The IC package of claim 1, wherein the plurality of thermal dissipating features is arranged in one or more arrays or matrices.

4. The IC package of claim 1, further comprising:
a sealing member disposed between the manifold and the IC die.

5. The IC package of claim 1, wherein the manifold comprises:
a first sidewall;
a second sidewall; and
a ceiling disposed between the first and the second sidewall, defining a central cavity that allows the IC die to be encased therein.

6. The IC package of claim 5, further comprising:
a plenum defined in a center portion of the ceiling.

7. The IC package of claim 6, wherein the plenum allows fluid to flow therethrough from an inlet to an outlet of the plenum.

8. The IC package of claim 1, wherein the plurality of thermal dissipating features has a circular configuration, a rectangular configuration, or a longitudinal structure.

9. The IC package of claim 1, wherein the thermal dissipating features have different aspect ratios.

10. The IC package of claim 1, further comprises:
a metallization layer disposed between the plurality of thermal dissipating features and the IC die.

11. The IC package of claim 1, wherein the thermal dissipating features are divided into a first and a second zone disposed on the IC die, wherein the first zone has a higher number of the thermal dissipating features than the second zone.

12. The IC package of claim 1, wherein the plurality of the thermal dissipating features has a top surface spaced apart from the manifold.

13. The IC package of claim 1, wherein the plurality of the thermal dissipating features has a top surface in direct contact with the manifold.

14. The IC package of claim 1, wherein the IC die has a second surface opposite to the first surface, wherein device structures are formed on the second surface of the IC die.

15. A temperature control element, comprising:
a plurality of thermal dissipating features configured to be disposed on a surface of an integrated circuit ("IC") die, wherein the plurality of thermal dissipating features further comprises:
a metallic pin fin disposed on a solder bump;
    a manifold having a plenum configured to encase the plurality of thermal dissipating features disposed on the IC die; and
    a spacer disposed between the plurality of thermal dissipating features and the manifold.

16. The temperature control element of claim 15, wherein the plenum is configured to receive fluid to control temperature of the IC die when in operation.

17. A method for manufacturing a temperature control element in an integrated circuit ("IC") package comprising an IC die, the method comprising:
disposing a plurality of thermal dissipating features on an IC die disposed on a printed circuit board ("PCB"), wherein the plurality of thermal dissipating features further comprises: a metallic pin fin disposed on a solder bump;

placing a manifold on the PCB to encase the IC die therein while maintaining the plurality of thermal dissipating features located in a plenum defined in the manifold;

disposing a spacer between the plurality of thermal dissipating features and the manifold; and supplying a fluid into the plenum to regulate a thermal energy transmitted from the IC die.

\* \* \* \* \*